United States Patent [19]

Gay

[11] 4,059,797
[45] Nov. 22, 1977

[54] A.C. CAPACITANCE MEASURING BRIDGE

[75] Inventor: Michel J. L. Gay, Fresnes, France

[73] Assignee: Office National d'Etudes et de Recherches Aerospatiales, Chatillon-sous-Bagneux, France

[21] Appl. No.: 754,578

[22] Filed: Dec. 27, 1976

[30] Foreign Application Priority Data

Dec. 30, 1975 France .................................. 75.40114

[51] Int. Cl.² .......................................... G01R 27/26
[52] U.S. Cl. .............................. 324/60 C; 324/DIG. 1
[58] Field of Search ............ 324/60 C, 60 R, DIG. 1; 73/517 B

[56] References Cited

U.S. PATENT DOCUMENTS

| 3,387,208 | 6/1968 | Foley | 324/60 R |
| 3,585,496 | 6/1971 | Ichijo | 324/60 R |
| 3,621,385 | 11/1971 | Ichijo | 324/60 R |
| 4,009,607 | 3/1977 | Ficken | 73/517 B X |

Primary Examiner—Stanley T. Krawczewicz

[57] ABSTRACT

Alternating current capacitance measuring bridge for measuring the capacitance of capacitors having one electrode connected to an external earth. It comprises a first metal screen box connected to the common terminal of the secondary windings of a differential transformer and directly to screened coaxial connections of capacitors inside of which an alternating voltage source and the transformer are placed, and means for d.c. supplying the source via internal d.c. supply terminals comprising a first winding connecting to the common terminal of secondary windings and the external earth, a second and third windings connecting to the internal d.c. supply terminals and external d.c. supply terminals, the first, second and third windings having a high impedance at the operational frequency of the source, two capacitors of high impedance inserted between the internal d.c. supply terminals and said first screen box, and two other capacitors of high impedance inserted between the external d.c. supply terminals and the external earth. In addition, the measuring bridge comprises a second metal box screen containing all the elements of the measuring bridge and connected to the external earth. The screened coaxial connections comprise either external conductors connected to the external earth, or internal conductors connected to the first metal screen box and external conductors connected to the external earth, so as to eliminate mutual capacitance errors coming from induced currents between conductors of the screened coaxial connections.

7 Claims, 8 Drawing Figures

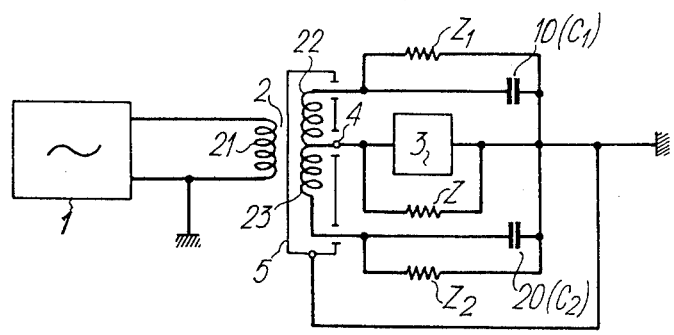
FIG.1 (Prior art)
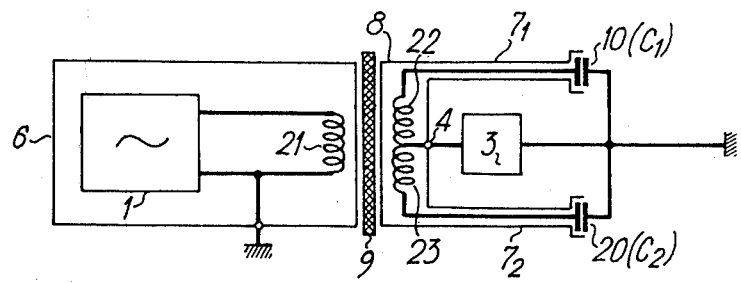
FIG.2 (Prior art)
FIG.3
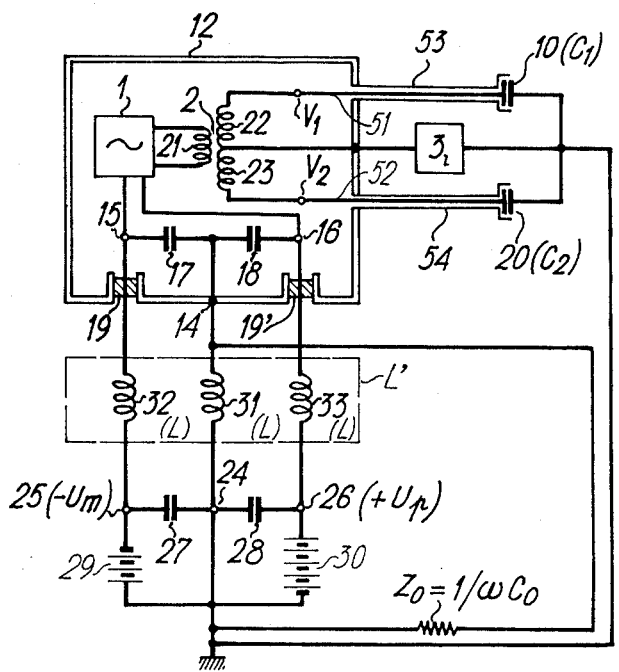

Zero shift during the starting up

A.C. CAPACITANCE MEASURING BRIDGE

CROSS REFERENCES TO RELATED APPLICATIONS

Applicant hereby makes cross references to his French Patent application PV 75 40144, filed Dec. 30, 1975 and claims priority thereunder following the provisions of 35 U.S.C. 119.

BACKGROUND OF THE INVENTION

1. Field of the Invention

This invention relates to an alternating current capacitance measuring bridge of high accuracy, capable of measuring variations in capacitance of the order $10^{-5}$ to $10^{-6}$ picofarads.

2. Description of the Prior Art

The problem of measuring small capacitances appears in numerous techniques. For example, in the detection devices of accelerometers of concentric spherical cage and ball type described in U.S. Pat. No. 3,438,267 of the 28th Mar. 1966 to Pierre CONTENSOU, Michel DELATTRE and Michel GAY, the small capacitance variations of a micro-accelerometer are measured. The micro-accelerometer comprises a capacitor formed of a spherical ball concentric to a cage having a diameter slightly greater than that of the ball so that the latter can move in the cage. For example, it is known to measure the displacements or the variations of pressure by means of sensors or capacitive measuring devices in which a variation of distance or a variation of pressure is converted into a variation of capacitance.

The alternating current measuring bridges of known type generally comprise an alternating voltage source feeding the primary winding of a differential transformer, two capacitors, one of which is for reference and preferably adjustable, and the other of which provides the capacitance to be measured, inserted in the circuits of two secondary windings of the differential transformer which have a common terminal and a measuring apparatus for the unbalanced current between the secondary windings inserted in the common terminal.

As in practically all applications, the capacitors whose capacitances are to be measured, have one electrode connected to earth, the impedances relative to earth of the secondary winding of the differential transformer of the measuring bridge are in parallel with the capacitances to be measured which limits the performance and the long-term stability of the said measuring bridge.

It has also been proposed in the prior art to screen the primary winding of the differential transformer by a first screen and the secondary windings of this transformer by a second screen, the second screen also comprising the external envelopes of conductors of the coaxial connections from the secondary windings to the capacitances and being connected to the common terminal of the secondary windings. The mutual impedance of these two screens and the Foucault current developed in the second screen by the magnetic flux coming from the first screen provide a limitation on the performance of the measuring bridges.

SUMMARY OF THE INVENTION

Therefore, it is an object of the present invention to provide an alternating current capacitance measuring bridge which has not these disadvantages and resolution error of which is only limited on the thermal noise.

Another object of the present invention is to provide an alternating current bridge for remote measuring capacitances of capacitors.

In accordance with the aforementioned objects, there is provided an alternating current capacitance measuring bridge for measuring the capacitance of capacitors having one terminal connected to an external earth comprising an alternating voltage source, a differential transformer having a primary winding connected to said alternating voltage source and two secondary windings having a common terminal, screened coaxial connections for connecting said capacitors to said secondary windings, a detector inserted in said common terminal of said secondary windings via an amplification stage, a first metal screen box connected to said common terminal of said secondary windings inside of which said alternating voltage source and said primary and secondary windings are placed, whose interior is connected directly to first conductors of the screens of said screened coaxial connections, which surround coaxially the internal conductors of said screened coaxial connections, means for direct current supplying said alternating voltage source via internal direct current supply terminals comprising a first winding connecting to said common terminal of said secondary windings and said external earth, a second and third windings connecting to said internal direct current supply terminals and external direct current supply terminals, said first, second and third windings having a high impedance at the operational frequency of said alternating voltage source, two first capacitors of high impedance inserted between said internal direct current supply terminals and said metal screen box, and two second capacitors of high impedance inserted between said external direct current supply terminals and said external earth.

In another feature of the present invention, the measuring bridge comprises a second metal box screen containing all the elements of the measuring bridge and connected to the external earth.

In these features of the present invention, the screened coaxial connections comprise either second conductors connected to the external earth, or second conductors connected to the first metal screen box and third conductors connected to the external earth, so as to eliminate mutual capacitance errors coming from induced currents between conductors of the screened coaxial connections.

BRIEF DESCRIPTION OF THE DRAWINGS

The foregoing and other objects, features and advantages of the present invention will be apparent from the following more particular description of the preferred embodiments of the invention as illustrated in the accompanying drawings.

FIGS. 1 and 2 represent prior art measuring bridges;

FIG. 3 is a circuit diagram of a measuring bridge in accordance with the invention;

DESCRIPTION OF THE PREFERRED EMBODIMENTS

Figure 4:
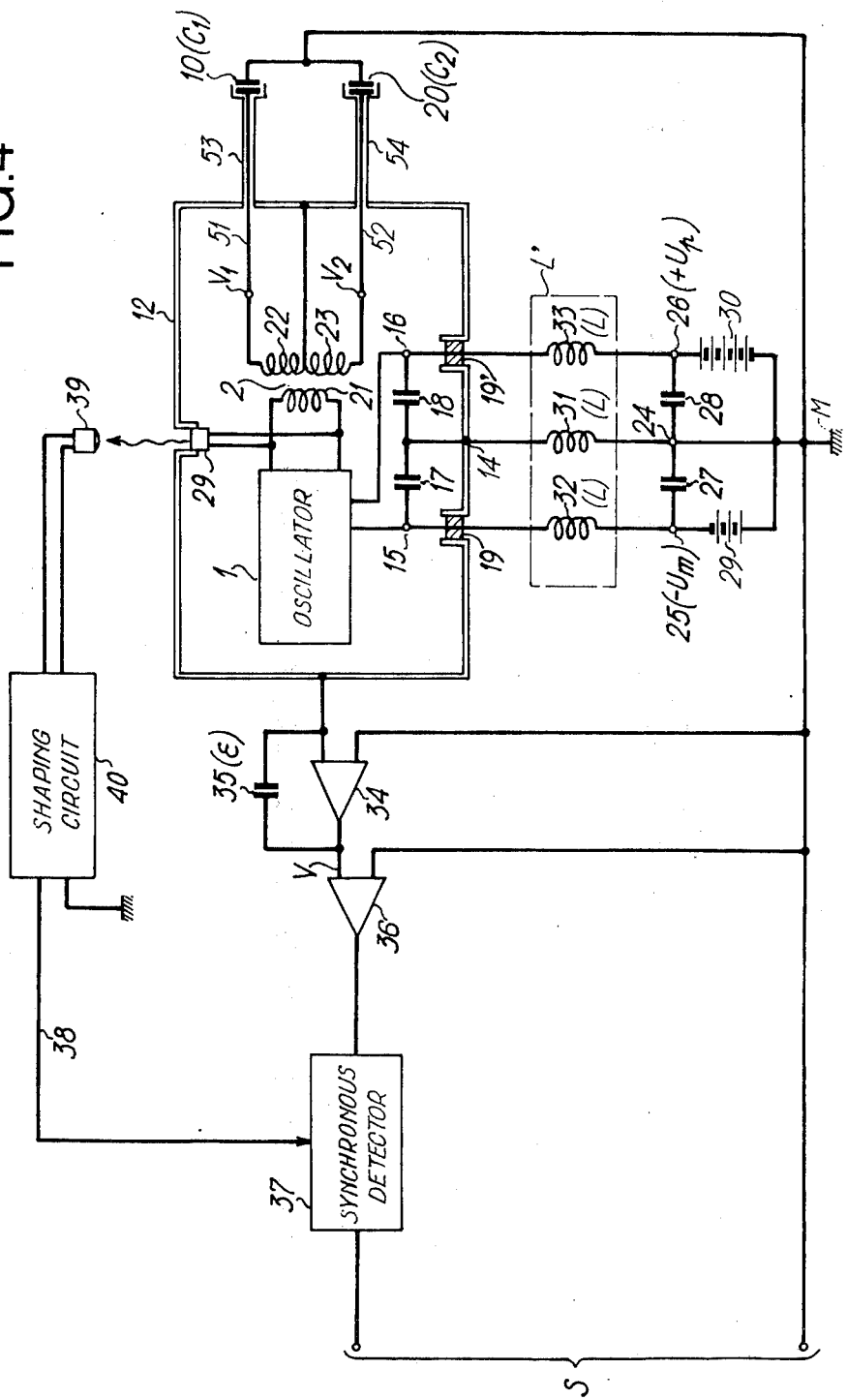
FIG. 4 represents the complete circuit diagram of a measuring bridge in accordance with the invention, comprising amplifiers for the output signal as well as a synchronous detector.

Referring to FIG. 1, a prior art capacitance measuring bridge in which, as is necessary in a large number of applications, the reference capacitor and the capacitor to be measured have one of their terminals connected to earth, comprises a sinusoidal voltage source 1 at the measurement frequency ($\omega/2\pi$) feeding the primary winding 21 of a differential transformer 2, a reference capacitor 10 the capacitance $C_1$ of which can be adjusted, inserted between the outer terminal of the first secondary winding 22 and earth, a capacitor 20 whose capacitance $C_2$ is to be measured, inserted between the outer terminal of the second secondary winding 23 and earth, and a detector 3 connected between the common middle point 4 of the two secondary windings and earth. Given the voltages $V_1$ and $V_2$ at the terminals of the secondary windings of the differential transformer, the amount of unbalanced S between the circulating currents into the circuits of the secondary windings detected by the detector 3 allows the quantity $C_1 V_1 + C_2 V_2$ to be known. It can be seen that it is indispensable, for the accuracy of the measurements and their stability that the impedances relative to earth of the outputs of the differential transformer 2, shown in FIG. 1 by impedances $Z_1$, $Z_2$ and $Z$ are large relative to the impedances $1/\omega C_1$ and $1/\omega C_2$ of the capacitors 10 and 20 and the impedance of the detector 3, that these impedances relative to earth are stable in time, and that $Z_1$ and $Z_2$ are balanced. Besides, a screen box 5 surrounds the secondary windings so as to eliminate any capacitive coupling between the primary and secondary windings. In summary, the disadvantages of these bridges are on the one hand limited performances and long-term stability, and on the other hand use of an expensive transformer.

In the capacitance measuring bridge of FIG. 2, which also belongs to the prior art, the elements of the measuring bridge of FIG. 1 can be identified but, in addition, the sinusoidal voltage source 1 and the primary winding 21 are completely screened by a screen box 6 connected to earth and the screening of the secondary windings is followed by the external conductors $7_1$ and $7_2$ of the coaxial connections from the secondary windings to the capacitors 10 and 20 so as to form a screen 8 connected to the middle point 4 of the transformer 2. Finally the screens 6 and 8 are isolated by a dielectric screen 9.

Experience shows that effectively the influence of the noise impedances $Z_1$ and $Z_2$ is eliminated. Nevertheless, the screen 8 introduces a new error. This error can be separated into two parts:
variation in the sensitivity of the detector 3 in the case of an elongation measurement, due to the impedance of the screen 8 relative to the screen 6;
zero error due to the Foucault current terms induced by the magnetic flux in the screen 8.

In summary, the second prior art embodiment (FIG. 2) is characterized on the one hand by a superior quality to the first prior art embodiment (FIG. 1), allowing for example equivalent measurements by replacing the rigid coaxial connections a few centimeters long between the measuring bridge and the capacitors by flexible coaxial connections a few meters long and on the other hand by a transformer cost price more expensive than that in accordance with the first prior art embodiment.

Referring now to FIG. 3, which represents a circuit diagram of a measuring bridge in accordance with the invention, circuit which is to be compared with that of FIG. 2, it can be seen that the oscillator or the sinusoidal voltage source 1 is placed inside a closed metal screen box 12 which is extended to the capacitors whose capacitances $C_1$ and $C_2$ are to be measured owing to respective flexible coaxial connections with internal conductors 51 and 52 and external conductors 53 and 54. An induced current circulates inside the screen without effecting potential of the screen box 12 which depends only on capacitances $C_1$ and $C_2$ of the capacitors 10 and 20, voltages $V_1$ and $V_2$ of the secondary windings, the input impedance $Z'_0$ of the detector 3, and the leakage impedance $Z_0$ of the screen box 12 relative to earth.

FIG. 3 shows, in addition, means for ensuring the direct voltage supply to the interior of the box without losing the previous advantages, i.e. by maintaining a high leakage impedance $Z_0$. One is limited, by way of example, to frequent case of supply by two direct voltage sources $+U_p$ and $+U_m$ of opposite sign respectively 30 and 29, but the device can be adapted without difficulty to any number of sources.

A winding 31 of high inductance L connects the terminal 14 of the screen box 12 to an exterior earth terminal 24. Two internal d.c. supply terminals 15 and 16 of the oscillator 1 to the screen box 12 are connected, through insulating cross-pieces 19 and 19', sufficiently narrow to avoid any leakage of the electric filed lines between the interior and exterior of the screen box 12, to external d.c. supply terminals 26 and 25 held respectively at potentials $+U_p$ and $-U_m$ via the two intermediary windings 32 and 33 of inductances equal to L. Capacitors 27, 28 having a high capicitance are inserted between the exterior earth 24 and the external terminals 25 and 26 and capacitors 17, 18 having a high capacitance are inserted between the terminal 14 of the screen box 12 and the internal terminals 15 and 16. Because of the high capacitance of these capacitors 17, 18 and 27, 28 thanks to which the terminals 14, 15, 16 and 24, 25, 26 are at the same alternating potential, the three windings 31, 32, 33 of the inductance are equivalent to a single winding of inductance L' equal to L/3, corresponding to a high impedance $Z_0 = \omega L'$, at the angular frequency $\omega$ used for the measurement. On the contrary, the windings 31, 32, 33 have a negligible resistance with a direct current operation. The electrical energy supply can also be made by means of a single winding of inductance L' comprising three distinct wires wound on the same magnetic core. The leakage impedance $Z_0$ of the screen box 12 relative to earth is essentially capacitive; i.e. its value is $1/\omega C_0$. The value of the inductance coil is chosen so as to form with $C_0$ a resonant circuit of high quality factor Q at the angular frequency $\omega$. Under these conditions, the impedance $Z_0$ has for its modulus value $Q/\omega C_0$, notably higher than $1/\omega C_0$.

FIG. 4 shows a complete example of a capacitance measuring bridge in accordance with the invention. The oscillator 1, the differential transformer 2, the coaxial connections 51-53 and 52-54 for connecting the capacitors 10 and 20 to the secondary windings 22, 23 of the transformer, the windings 31, 32 and 33, and the capacitors 17, 18 and 27, 28 of the direct current supply system can be seen. Under these conditions, the output voltage of the measuring bridge is the voltage between the box 12 and the earth terminal 24. It is applied to the input of the operational amplifier 34, shown with a feedback capacitor 35 having a capacitance $\epsilon$. The output signal of the amplifier 34 is equal to:

$$V = -(V_1C_1 + V_2C_2)/\epsilon$$

This signal is amplified in an amplifier 36 of magnification factor $-K$ and then applied to a synchronous detector 37. The output signal S of the detector 37 is equal to $S = K(V_1C_1 + V_2C_2)$ and if $V_1 = -V_2$, equal to $S = K'(C_1 - C_2)$. Of course, the phased reference signal coming from the oscillator 1 must not be lead through a connection line leaving the screen box 12, this latter having to form a chamber from which no alternating signal escapes. This phase reference signal is taken from the terminals of the primary winding 21 by an electroluminescent diode 29 co-operating with a photo-transistor 39. The output signal of the photo-transistor 39 is lead to the synchronous detector 37 by the line 38, after having been shaped if necessary, by a shaping circuit 40.

The dimensions and characteristics of the elements of FIG. 4 are for example the following:

| | |
|---|---|
| length of the coaxial connections 51 - 53 and 52 - 54: | 1.50 meter of flexible cable |
| diameter of the coaxial connections 51 - 53 and 52 - 54: | 3 millimeters |
| capacitance of the coaxial lines: | 1400 pico farads |
| capacitance of the screen box 12: | 120 pico farads |
| capacitance $\epsilon$ of the feedback capacitor 35: | 100 pico farads |
| measuring frequency $\omega/2\pi$: | 52 Kilohertz |
| inductance L' | $6 \times 10^{-3}$ Henry |
| voltages of secondary windings 22 and 23 $V_1 = -V_2$: | 30 effective voltages |
| coefficient K' | $10^3$ volts per picofarad |

The measuring bridge can be used in a zero and elongation method. In the zero method, the system is adjusted to produce a zero output signal; $C_1$ can be a variable capacitor which is adjusted until the output signal S is zero. One has thus:

$$C_2 = C_1$$

In the elongation method, in the particular case wherein $C_1 = O$, i.e. where no capacitor is placed at one of the outputs of the secondary winding of the transformer 2, one has:

$$C_2 = +S/KV_2$$

Figure 5:
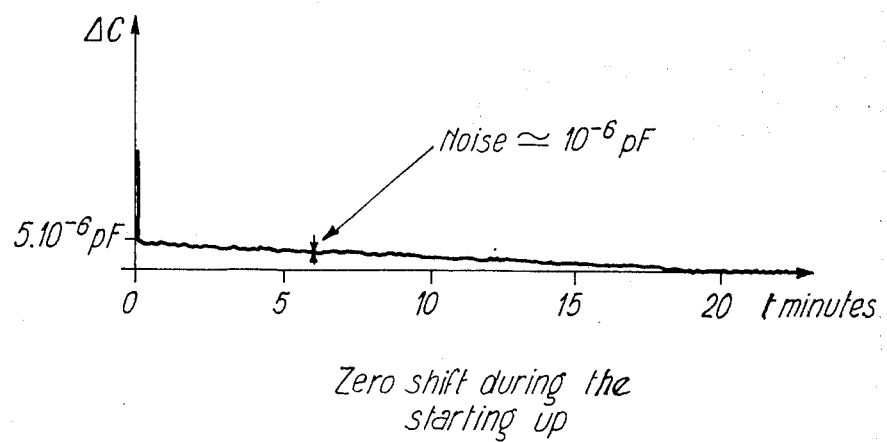
FIG. 5 is a draft showing, as a function of time, the output signal of the capacitance measuring bridge in the case where capacitors having given capacitances are being measured, as the apparatus is put into operation.

FIG. 5 shows the zero shift in picofarads during the starting up of a measuring bridge in accordance with the invention made by the applicant. Once the apparatus is in operation, it is possible to obtain a measuring accuracy between $10^{-5}$ and $10^{-6}$ pF.

Figure 6:
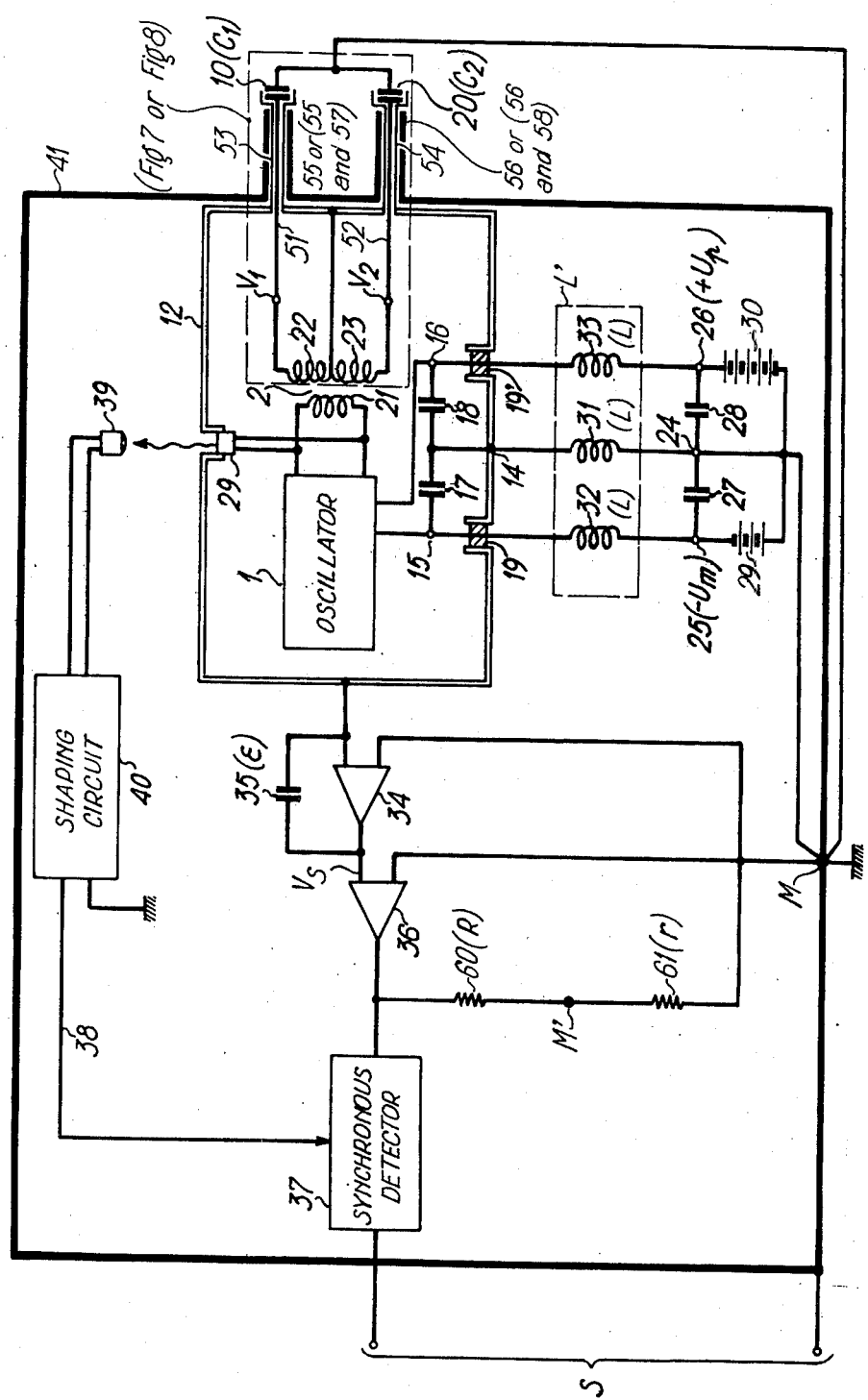
FIG. 6 represents the complete circuit diagram of a measuring bridge analog to that of FIG. 4 for remote measurements.
Figure 7:
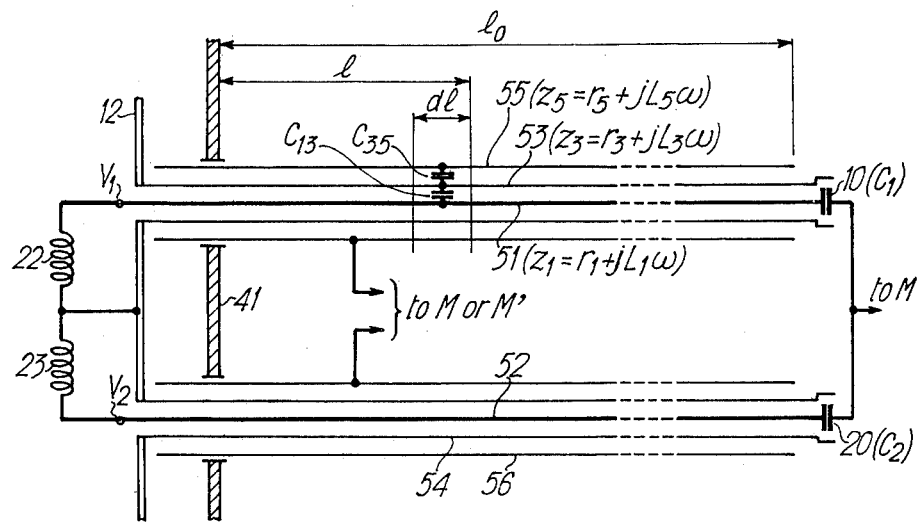
FIGS. 7 and 8 represent a first and a second embodiments of coaxial connections from the secondary windings of the differential transformer to the capacitors having capacitances to be measured.
Figure 8:
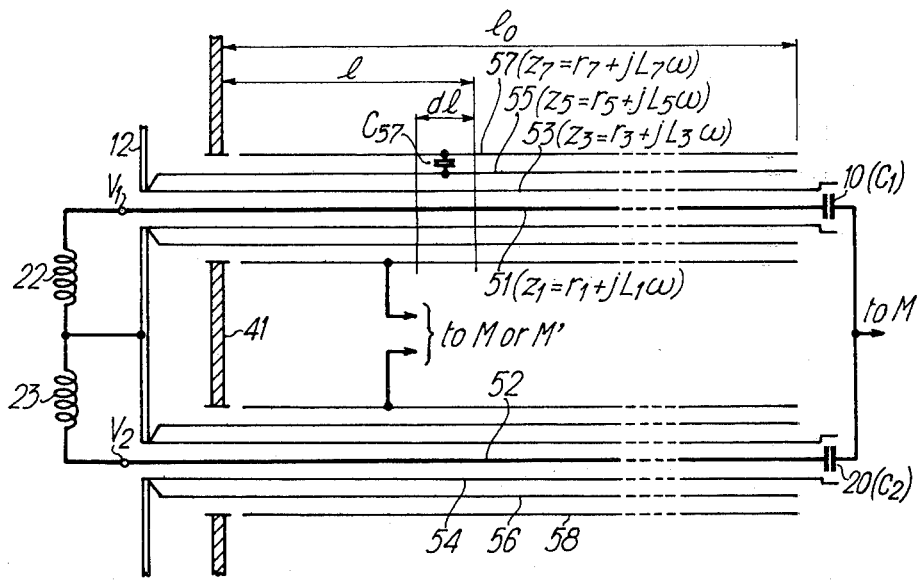

A second embodiment of an alternating current capacitance measuring bridge in accordance with the present invention is represented in FIG. 6, and in detailed part in FIGS. 7 and 8. In this case, the capacitors 10, 20 are a large distance $l_o$ off.

Referring to FIG. 6, which is to be compared with FIG. 4, it can be seen that the elements represented in FIG. 4, i.e. the metal screen box 12, the direct current supply system, the amplifier stage 34-36, the synchronous detector 37 and the shaping circuit 40 are placed inside of a large external metal screen box 41. This screen box 41 is connected to the external earth terminal 24 or M. Two screening types of the coaxial connections 51-53 and 52-54 are respectively represented in FIGS. 7 and 8.

Referring now to FIG. 7 in accordance with a first screening type, the conductors 55 and 56 surround coaxially the conductors 53 and 54. The coaxial connections 51-53-55 and 52-54-56, as these hereinafter described, are flexible so as to connect the capacitors 10 and 20, capacitances of which are to be measured, to the measuring bridge on normal accessibility conditions of a laboratory.

The coaxial connections 51-53 and 52-54 are shielded from external inductions, since in this case the conductors 55 and 56 are connected to the external earth terminal M.

Here, one supposes that each conductor of each coaxial connection has a length $l_o$ from the screen boxes 12 and 41 divided into elementar portions dl and that the lineic impedance z of each conductor is very small relative to its lineic succeptance 1/Cp at the used angular frequency $\omega$ (p is the complex variable $j\omega$).

For example, referring to the coaxial connections 51-53-55, internal conductor of which is at voltage $V_1$, the lineic impedances of the conductors 51, 53, 55 are designated by $z_1$, $z_3$, $z_5$, the lineic mutual capacitances between the conductors 51 and 53, and between the conductors 53 and 55 by $C_{13}$ and $C_{35}$. d Under these conditions, a portion dl of the conductor 51 generates an elementar capacitive current di:

$$di = V_1 C_{13} p \, dl$$

which induces an elementar voltage $dv_3$ into the conductor 53 increasing from the screen boxes 12 and 41 to the capacitor 10 and issued from the characteristic lineic inductance $L_3$ of the conductor 53:

$$dv_3 = V_1 C_{13} p \, z_3 \, l \, dl \tag{1}$$

where $l$ is the distance from portion dl to the screen boxes 12 and 41.

The induced voltage $V_3$ at a point of conductor 53 a length $l_1$ apart the screen boxes 12 and 41 depends on all the portions dl directly added for $1 \leq l_1$ and all the portions added for $1 > l_1$ account being taken of the ratio $(z_3 l_1 /z_3 l)$. Then the following relation $$V_3(l_1) = \int_0^{l_1} dv_3 + \int_{l_1}^{l_o} \frac{l_1}{l} dv_2 \tag{2}$$

given by substitution for $l_1$ to 1:

$$V_3(l) = V_1 z_3 C_{13} (l_o l - l^2/2)p \tag{3}$$

In an analog manner, the voltage $V_3$ induces also a voltage $V_5$ into the external screen conductor 55. The potential $V_5$ is issued from an analog relation to (1) by substituting for $dv_3$ to $dv_5$, $V_1$ to $V_3$, $C_{13}$ to $C_{35}$ and $z_3$ to $z_5$. After calculation, the voltage $V_5$ is given by the following relation:

$$V_5(l) = V_1 z_3 z_5 C_{13} C_{35} (l_o^3 \tfrac{l}{} - l_o l^3/6 + l^4/24)p^2 \tag{4}$$

The mutual capacitive influence between two adjacent conductors of a portion dl depends on the pair of regarded conductors:

between the conductors 51 and 53, an induced current circulates to the internal screen box 12, and therefore, this current has not influence at the positive input of the operational amplifier 34 connected to the feedback capacitor 35;

between the conductors 53 and 55, an induced current dI circulates from conductor 55 to the external earth terminal M:

$$dI = [V_3(1) - V_5(1)] C_{35} p \, dl \quad (5)$$

Thus the positive input of the operational amplifier 34 receives a total current I issued from the screening of the conductor 51:

$$I = \int_{l=0}^{l=l_0} dI \quad (6)$$

An output voltage $V_S$ of the operational amplifier 34 corresponding to the current $I$ can be interpreted as proportional to a capacitive error $\Delta C_5$ such as:

$$\Delta C_5 = -\epsilon V_S/V_1 = -\epsilon (-I/\epsilon p)/V_1 \quad (7)$$

By substitution for $I$, $dI$, $V_3$, $V_5$ given by the relations (3), (4), (5) and (6) into the preceding relation, and by writing $z_1$, $z_3$, $z_5$ in fonction of lineic resistances $r_1$, $r_3$, $r_5$ and lineic inductances $L_1$, $L_3$, $L_5$, one deduces the phase and quadrature error terms, respectively the real and imaginary components $\Delta C_5$:

$$Re(\Delta C_5) = -\tfrac{1}{3} L_3 C_{13} C_{35} l_0^3 \omega^2 + \tfrac{2}{15} r_3 r_5 C_{13} C_{35}^2 l_0^5 \omega^2 - \tfrac{2}{15} L_3 L_5 C_{13} C_{35}^2 l_0^5 \omega^4 \quad (8)$$

$$Im(\Delta C_5) = \tfrac{1}{3} r_3 C_{13} C_{35} l_0^3 \omega + \tfrac{2}{15}(L_5 r_3 + L_3 r_5) C_{13} C_{35}^2 l_0^5 \omega^3 \quad (9)$$

By way of example, the applicant has carried out the measurements of phase and quadrature errors in the elongation method wherein $C_2 = 0$. In this case, the characteristics and dimensions of screened coaxial connection 51-53-55 with flexible conductors are the following:

length of the connection: $l_o = 15$ meters
lineic resistances: $r_1 = 0.695$; $r_3 = 5.21 \, 10^{-2}$; $r_5 = 2.92 \, 10^{-2}$ ohm/meter
lineic inductances: $L_1 = L_3 = L_5 = 3.18 \, 10^{-7}$ Henry/meter
mutual lineic capacitance: $C_{13} = 10^{-10}$ and $C_{35} = 3.09 \, 10^{-10}$ Farad/meter
measuring frequency: $\omega/2\pi = 50$ kilohertz The calculated phase and quadrature errors by means of relations (8) and (9) are the following:

$Re(\Delta C_5) = -1,09 \, 10^{-12}$ Farad $Im(\Delta C_5) = 5,69 \, 10^{-13}$ Farad These values have experimentally been confirmed to a nearest error of $5.10^{-13}$ and $5.10^{-14}$ Farad respectively.

Nevertheless, the noise voltages $V_3$ and $V_5$ generated by the screened type of the FIG. 7, which induce the phase and quadrature errors Re ($\Delta C_5$) and Im ($\Delta C_5$), present limitations of measurement accurately.

On the one hand, the quadrature error term relation to the measurement signal, which is not measured by the synchronous detector 35, can sature the amplification stage 34-36, when the two screened coaxial connections 51-53-55 and 52-54-56 are asymmetrical and more especially as the magnification factor of the amplification stage 34-36 is high. On the other hand, the phase error term, which depends upon the asymmetric, appears in the capacitances of capacitors to be measured.

For eliminating these disadvantages, other conductors 57 and 58 surround coaxially the preceding coaxial connections 51-53-55 and 52-54-56 respectively, and are directly connected to the earth terminal M, as shown in FIG. 8. In this second screened type, the conductors 53, 55 and 54, 56 are connected to the internal screen box 12. Thus a mutual capacitance $C_{57}$ between the conductors 55 and 57 is defined in an analog manner to the capacitance $C_{35}$ of the first screened type.

From suppositions and relations analog to the preceedings, one deduces an induced voltage $V_7$ by the conductor 55 into the external conductor 57 of lineic impedance $z_7$:

$$V_7(1) = V_1 z_3 z_5 z_7 C_{13} C_{35} c_{57} (2 \, l_o^5 1/15 - l_o^3 1^3/18 + l_o 1^5/120 - 1^6/720) p^3$$

and the phase and quadrature errors Re ($\Delta C_7$), Im ($\Delta C_7$) corresponding to a capacitive error $\Delta C_7$ which is defined by an analog relation to (7) and depends on induced current circulating from the conductor 57 to the earth terminal M.

$Re(\Delta C_7) =$
$\quad -\tfrac{2}{15} r_3 r_5 C_{13} C_{35} C_{57} l_o \omega^2$
$\quad +\tfrac{2}{15} L_3 L_5 C_{13} C_{35} C_{57} l_o \omega^4$
$\quad -\tfrac{17}{315}(L_3 r_5 r_7 + L_5 r_7 r_3 + L_7 r_3 r_5) C_{13} C_{35} C_{57} l_o^7 \omega^4$
$\quad +\tfrac{17}{315} L_3 L_5 L_7 C_{13} C_{35} C_{57} l_o^7 \omega^6$ $Im(\Delta C_7) =$
$\quad -\tfrac{2}{15}(L_5 r_3 + L_3 r_5) C_{13} C_{35} C_{57} l_o^5 \omega^3$
$\quad +\tfrac{17}{315} C_{13} C_{35} C_{57} r_3 r_5 r_7 l_o^7 \omega^3$
$\quad -\tfrac{17}{315}(r_7 L_3 L_5 + r_3 L_5 L_7 + r_5 L_7 L_3) C_{13} C_{35} C_{57} l_o^7 \omega^5$ $r_7$ et $L_7$ are the lineic resistance and inductance of the conductor 57.

With characteristics and dimensions of conductors 51, 53, 55 and with a measuring frequency equal to these aforementioned with in the example of the first screened type, and with a conductor 57 having the following characteristics:

lineic resistance: $r_7 = 2.92 \, 10^{-2}$ ohm/meter
lineic inductance: $L_7 = 3.18 \, 10^{-7}$ Henry/meter
mutual capacitance with the conductor 55: $C_{57} = 1.38 \, 10^{-10}$ Farad/meter the phase and quadrature errors are the following:
$Re(\Delta C_7) = -3.61 \, 10^{-16}$ Farad and
$Im(\Delta C_7) = -3.46 \, 10^{-16}$ Farad Thus these values, which are to be compared with Re ($\Delta C_5$) and Im ($\Delta C_5$), affect the result of measurements thousand times less than these of the first screened type. This improvement allows to use higher magnification factors, without saturation of the amplifiers 34 and 36 by the quadrature error and without affectation of the measurements by the phase error.

Referring now to FIG. 6, the present invention provides, in addition, to insert two resistances 60 and 61 of respective values R and r between the output of the amplifier 36 and the earth terminal M, so as to compensate the variations of mutual capacitances owing to the large length $l_o$ of screened coaxial connections.

Thus, in the first screened type the conductors 55 and 56 are connected to the common terminal L' of the resistances 60 and 61 instead of the earth terminal M, and in an analog manner, the conductors 57 and 58 of the second screened type are also connected to the terminal M'.

A portion of the output signal of R+amplifier 36 proportional to the ratio $r/(r+r)$ is then taken before the synchronous detection. Experimentally one shows the variations of the second order sensitivity of the mutual capacitance $C_{35}$ or $C_{57}$ are eliminated.

What I claim is:

1. An alternating current capacitance measuring bridge for measuring the capacitance of capacitors having one terminal connected to an ground comprising an alternating voltage source, a differential transformer having a primary winding connected to said alternating voltage source and two secondary windings having a common terminal, screened coaxial connections for connecting said capacitors to said secondary windings, a detector inserted in said common terminal of said secondary windings via an amplification stage, a first metal screen box connected to said common terminal of said secondary windings inside of which said alternating voltage source and said primary and secondary windings are placed, whose interior is connected directly to first conductors of the screens of said screened coaxial connections, which surround coaxially the internal conductors of said screened coaxial connections, means for direct current supplying said alternating voltage source via internal direct current supply terminals comprising a first winding connecting to said common terminal of said secondary windings and said external earth, a second and a third windings connecting to said internal direct current supply terminals and external direct current supply terminals, said first, second and third windings having a high impedance at the operational frequency of said alternating voltage source, two first capacitors of high impedance inserted between said internal direct current supply terminals and said first metal screen box, and two second capacitors of high impedance inserted between said external direct current terminals and said external earth.

2. An alternating current capacitance measuring bridge according to claim 1 in which the detector connected between the metal screen box and the ground to the metal box via the amplification stage is a synchronous detector, wherein the signal produced by said alternating voltage source is transmitted to said synchronous detector by an electroluminescent diode connected to said primary winding of said differential transformer, said diode co-operating through a small hole formed in said first metal screen box, with a photo-transistor outside said first metal screen box and connected to said synchronous detector.

3. An alternating current capacitance measuring bridge according to claim 2, comprising a second metal screen box connected to said ground to said second screen box, inside of which said first metal screen box, said detector, said amplification stage and said direct current supplying means are placed.

4. An alternating current capacitance measuring bridge according to claim 3, in which said screened coaxial connections comprise second conductors surrounding coaxially said first conductors and connected to said ground.

5. An alternating current capacitance measuring bridge according to claim 3, in which said screened coaxial connections comprise second conductors surrounding coaxially said first conductors and connected to said first metal screen box, and third second conductors surrounding coaxially said second conductors and connected to said ground.

6. An alternating current capacitance measuring bridge according to claim 4, in which said second conductors are connected to said ground via a first resistance connected to the output of said amplification stage by means of a second resistance, the value of said first and second resistance being selected for compensating mutual capacitance between said conductors of said screened coaxial connections.

7. An alternating current capacitance measuring bridge according to claim 5, in which said third second conductors are connected to said ground via a first resistance connected to the output of said amplification stage by means of a second resistance, the value of said first and second resistances being selected for compensating mutual capacitances between said conductors of said screened coaxial connections.

* * * * *